United States Patent
Kim

(10) Patent No.: US 8,395,610 B2
(45) Date of Patent: Mar. 12, 2013

(54) DRIVING CHIP, DRIVING CHIP PACKAGE HAVING THE SAME, DISPLAY APPARATUS HAVING THE DRIVING CHIP, AND METHOD THEREOF

(75) Inventor: Ah-Reum Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 813 days.

(21) Appl. No.: 12/173,316

(22) Filed: Jul. 15, 2008

(65) Prior Publication Data
US 2009/0027366 A1  Jan. 29, 2009

(30) Foreign Application Priority Data
Jul. 24, 2007  (KR) .................. 10-2007-0073805

(51) Int. Cl.
G06F 3/038 (2006.01)
G09G 3/20 (2006.01)
G09G 3/36 (2006.01)
G09G 5/00 (2006.01)

(52) U.S. Cl. ............. 345/211; 345/55; 345/98; 345/204

(58) Field of Classification Search .............. 345/55, 345/84, 87–107, 204–215; 257/738
See application file for complete search history.

(56) References Cited

U.S. PATENT DOCUMENTS

| | | | | |
|---|---|---|---|---|
| 6,204,567 B1 * | 3/2001 | Imamura | ...................... | 257/797 |
| 6,342,727 B1 * | 1/2002 | Fujimori | ...................... | 257/668 |
| 6,759,732 B1 * | 7/2004 | Imamura | ...................... | 257/668 |
| 7,283,130 B2 * | 10/2007 | Takenaka et al. | ............. | 345/206 |
| 7,327,411 B2 * | 2/2008 | Yoon et al. | ....................... | 349/33 |
| 2001/0013654 A1 * | 8/2001 | Kalidas et al. | ................ | 257/738 |
| 2002/0014895 A1 * | 2/2002 | Tamai | .......................... | 324/765 |
| 2003/0001808 A1 * | 1/2003 | Sakuma et al. | .................. | 345/87 |
| 2003/0092217 A1 * | 5/2003 | Coyle | ........................... | 438/106 |
| 2004/0145552 A1 * | 7/2004 | Song et al. | ...................... | 345/87 |
| 2004/0189566 A1 * | 9/2004 | Nakamura et al. | ............. | 345/87 |
| 2004/0257328 A1 * | 12/2004 | Lim | ............................. | 345/100 |
| 2005/0127936 A1 * | 6/2005 | Chen | ............................ | 324/770 |
| 2005/0128171 A1 * | 6/2005 | Chen et al. | ...................... | 345/87 |
| 2005/0162577 A1 * | 7/2005 | Yoon et al. | ...................... | 349/33 |
| 2005/0278512 A1 * | 12/2005 | Ehlig et al. | ..................... | 712/228 |
| 2006/0007086 A1 * | 1/2006 | Rhee et al. | ...................... | 345/87 |
| 2006/0017067 A1 * | 1/2006 | Kitagawa | ....................... | 257/207 |
| 2006/0077333 A1 * | 4/2006 | Imajo et al. | .................. | 349/149 |

(Continued)

FOREIGN PATENT DOCUMENTS

| | | |
|---|---|---|
| JP | 05-046097 | 2/1993 |
| JP | 2005-292505 | 10/2005 |

(Continued)

Primary Examiner — Bipin Shalwala
Assistant Examiner — Keith Crawley
(74) Attorney, Agent, or Firm — Cantor Colburn LLP

(57) ABSTRACT

A driving chip includes a main input part, a plurality of circuit cells and an auxiliary input part. The main input part includes a plurality of input terminals which receive an external signal. The circuit cells generate a driving signal in response to a signal applied from the main input part. The auxiliary input part is spaced apart from the circuit cells by a first distance that is shorter than a second distance between the main input part and the auxiliary input part. The auxiliary input part receives the external signal and applies the external signal to the circuit cells. Therefore, line resistance variation between the circuit cells of the driving chip and a power input terminal may be decreased, so that driving chip defects may be prevented.

18 Claims, 5 Drawing Sheets

U.S. PATENT DOCUMENTS

| | | | |
|---|---|---|---|
| 2006/0103620 A1* | 5/2006 | Joo et al. | 345/98 |
| 2006/0214894 A1* | 9/2006 | Cheng et al. | 345/87 |
| 2007/0170587 A1* | 7/2007 | Honda | 257/737 |
| 2007/0176917 A1* | 8/2007 | Kawano | 345/209 |
| 2008/0099916 A1* | 5/2008 | Chang et al. | 257/738 |
| 2008/0174535 A1* | 7/2008 | Yoon et al. | 345/90 |

FOREIGN PATENT DOCUMENTS

KR    1020060060969 A    6/2006

* cited by examiner

US 8,395,610 B2

DRIVING CHIP, DRIVING CHIP PACKAGE HAVING THE SAME, DISPLAY APPARATUS HAVING THE DRIVING CHIP, AND METHOD THEREOF

This application claims priority to Korean Patent Application No. 2007-73805, filed on Jul. 24, 2007, and all the benefits accruing therefrom under 35 U.S.C. §119, the contents of which in its entirety are herein incorporated by reference.

BACKGROUND OF THE INVENTION

1. Field of the Invention

The present invention relates to a driving chip, a driving chip package having the driving chip, a display apparatus having the driving chip, and a method thereof. More particularly, the present invention relates to a driving chip capable of preventing driving chip defects, a driving chip package having the driving chip, a display apparatus having the driving chip, and a method thereof.

2. Description of the Related Art

Generally, liquid crystal display ("LCD") apparatuses have various advantages, such as thinner thickness, lower driving voltage, lower power consumption, etc., compared to other types of display devices, such as cathode ray tube ("CRT") devices, plasma display panel ("PDP") devices, etc. Therefore, LCD apparatuses are used in notebook computers, monitors, televisions, mobile phones, etc.

An LCD apparatus includes a display panel substantially displaying an image, a source printed circuit board ("PCB") generating a plurality of driving control signals and a plurality of power signals for driving the display panel, and a plurality of driving chip packages electrically connecting the display panel to the source PCB.

Each of the driving chip packages includes a driving chip and a line substrate having the driving chip mounted thereon. The driving chip provides various driving signals for driving the display panel in response to the driving control signals and the power signals that are provided from the source PCB.

A plurality of input terminals receiving the driving control signals and the power signal and a plurality of output terminals outputting various driving signals for driving the display panel are formed on a first surface of the driving chip. Here, a power input terminal receiving the power signal is disposed at two end portions of signal input terminals receiving the driving control signals.

As the power signal applied through the power input terminal is used in a level shifter, an amplifier, etc. of circuit cells formed on the inside of the driving chip, a power line for electrically connecting the power input terminal to the circuit cells is formed on the inside of the driving chip.

Due to the positions of the circuit cells, a distance variation between the power input terminal and the circuit cells is generated, so that the line resistance of the power line may be varied.

BRIEF SUMMARY OF THE INVENTION

According to the present invention, it has been determined herein that due to the variations of line resistance of the power line because of the distance variation between the power input terminal and the circuit cells of a conventional driving chip, an output signal variation between output channels of the driving chip is generated, so that driving chip defects may be generated. The present invention provides a driving chip capable of decreasing a difference between output signals for driving a display panel.

The present invention also provides a driving chip package having the above-mentioned driving chip.

The present invention also provides a display apparatus having the above-mentioned driving chip.

In exemplary embodiments of the present invention, a driving chip includes a main input part, a plurality of circuit cells and an auxiliary input part. The main input part includes a plurality of main input terminals receiving an external signal. The circuit cells generate a driving signal in response to a signal applied from the main input part. The auxiliary input part is spaced apart from the circuit cells by a first distance that is shorter than a second distance between the main input part and the auxiliary input part. The auxiliary input part receives the external signal and applies the external signal to the circuit cells.

In an exemplary embodiment, the input part may include at least one main power input terminal receiving a power signal, and the auxiliary input part may include at least one auxiliary power input terminal receiving the power signal that is applied to the at least one power input terminal.

In an exemplary embodiment, the driving chip may further include an output part being formed in correspondence with the circuit cells. The output part may include a plurality of output terminals outputting the driving signal that is generated by the circuit cells to the exterior.

In an exemplary embodiment, the main input part may be formed along a length direction of a first end portion of the driving chip, the output part may be formed along a length direction of a second end portion of the driving chip, and the auxiliary input part may be formed between the main input part and the output part.

In an exemplary embodiment, the at least main one power input terminal, the output terminals and the at least one auxiliary power input terminal may have terminal shapes, respectively.

In an exemplary embodiment, the driving chip may further include a power line electrically connecting the circuit cells to the at least one power input terminal, and connecting to the circuit cells to the auxiliary input terminal. The power line may be electrically connected to an amplifier and a level shifter that are formed in the circuit cells.

In other exemplary embodiments of the present invention, a driving chip package includes a driving chip and a line substrate. The driving chip includes a main input part, a plurality of circuit cells and an auxiliary input part. The main input part includes a plurality of main input terminals receiving an external signal. The circuit cells generate a driving signal in response to a signal applied from the main input part. The auxiliary input part is spaced apart from the circuit cells by a first distance that is shorter than a second distance between the main input part and the auxiliary input part. The auxiliary input part receives the external signal and applies the external signal to the circuit cells. The line substrate includes an auxiliary power line being coupled to the driving chip. The auxiliary power line electrically connects a portion of the main input part to the auxiliary input part.

In still other exemplary embodiments of the present invention, a display apparatus includes a display panel, a circuit substrate and a driving chip package. The display panel displays an image. The circuit substrate outputs a plurality of driving control signals for driving the display panel and a power signal. The driving chip package electrically connects to the display panel and the circuit substrate. The driving chip includes a main input part, a plurality of circuit cells and an auxiliary input part. The main input part includes a plurality of main input terminals receiving an external signal. The circuit cells generate a driving signal in response to a signal applied from the main input part. The auxiliary input part is spaced apart from the circuit cells by a first distance that is shorter than a second distance between the main input part and the auxiliary input part. The auxiliary input part receives the external signal and applies the external signal to the circuit cells. The line substrate includes an auxiliary power line coupled to the driving chip. The auxiliary power line electrically connects a portion of the main input part to the auxiliary input part.

In yet other exemplary embodiments of the present invention, a method of reducing line resistance variation between circuit cells of a driving chip includes arranging an auxiliary power input terminal between a main power input terminal and an output part of the driving chip, the auxiliary power input terminal providing a signal to the circuit cells via a main power line, arranging a main power input pad and an auxiliary power input pad on a line substrate, electrically connecting the main power input pad and the auxiliary power input pad with an auxiliary power line formed on the line substrate, and disposing the driving chip on the line substrate to electrically connect the auxiliary power input terminal to the main power input terminal via the auxiliary power line.

According to the driving chip, the driving chip package having the driving chip, and the display apparatus having the driving chip, an auxiliary power input terminal is formed between the input terminals and output terminals of a driving chip, and an auxiliary power line electrically connecting a power input terminal to the auxiliary power input terminal is formed on a line substrate coupled to the driving chip. Therefore, line resistance variation between circuit cells of the driving chip and the power input terminal may be decreased, so that driving chip defects may be prevented.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION OF THE INVENTION

Figure 1:
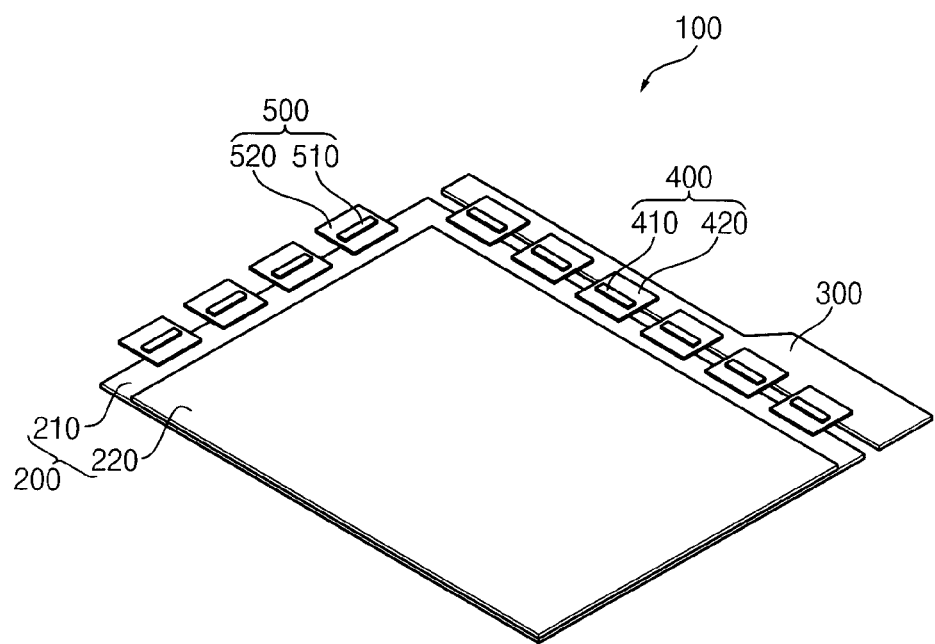
FIG. 1 is a perspective view illustrating an exemplary display apparatus according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

FIG. 1 is a perspective view illustrating an exemplary display apparatus 100 according to an exemplary embodiment of the present invention.

Referring to FIG. 1, the display apparatus 100 includes a display panel 200 substantially displaying images, a circuit substrate 300 outputting a plurality of driving control signals and a power signal for driving the display panel 200, and a first driving chip package 400 electrically connecting the display panel 200 to the circuit substrate 300.

The display panel 200 may include a first substrate 210, a second substrate 220 coupled to the first substrate 210, and a liquid crystal layer (not shown) interposed between the first and second substrates 210 and 220.

The first substrate 210 may include a thin-film transistor ("TFT") substrate having a plurality of TFTs that are switching elements, arranged in a matrix type, a plurality of gate lines extending in a first direction, and a plurality of data lines extending in a second direction which may be substantially perpendicular to the first direction. Each of the TFTs may include a gate electrode that is electrically connected to each gate line, a source electrode that is electrically connected to each data line, and a drain electrode that is electrically connected to a pixel electrode including an optically transparent and electrically conductive material.

The second substrate 220 may include a color filter substrate. The color filter substrate may be formed as a thin film and include, for example, a red color filter, a green color filter and a blue color filter to define a color for each pixel. The second substrate 220 may include, for example, a common electrode including an optically transparent and electrically conductive material. Alternatively, the red, green and blue color filters may be formed on the first substrate 210.

When a gate voltage is applied to the gate electrode of the TFT, the TFT is turned on, so that a data voltage is applied to the pixel electrode through the TFT. When the data voltage is applied to the pixel electrode, electric fields are generated between the pixel electrode of the first substrate 210 and the common electrode of the second substrate 220 to alter an arrangement of liquid crystal molecules of the liquid crystal layer disposed between the first substrate 210 and the second substrate 220. When the arrangement of liquid crystal molecules of the liquid crystal layer is altered, the optical transmissivity of the liquid crystal layer is changed, so that when light generated from a backlight assembly passes through the liquid crystal layer, an image is displayed.

The circuit substrate 300 may process an image signal from an external control device and power from an external power source to generate a plurality of driving control signals and a power signal for driving the display panel 200. The circuit substrate 300 may include a driving control section such as a timing control part generating the driving control signals, a power generating part generating the power signal, etc. The circuit substrate 300 may be disposed adjacent to a first end portion of the data lines of the display panel 200.

The first driving chip packages 400 may electrically connect to the circuit substrate 300 and the display panel 200. The first driving chip package 400 includes a first driving chip 410 and a first line substrate 420 having the first driving chip 410 mounted thereon. The first driving chip 410 outputs a plurality of data signals for driving the display panel 200 in response to a plurality of driving control signals and a power signal that are applied from the circuit substrate 300. An output terminal of the first driving chip package 400 is electrically connected to the data lines of the display panel 200.

The display apparatus 100 may further include a plurality of second driving chip packages 500 electrically connected to the gate lines of the display panel 200. The second driving chip package 500 may further include a second driving chip 510 and a second line substrate 520 having the second driving chip 510 mounted thereon. The second driving chip 510 outputs a plurality of gate signals for driving the display panel 200 in response to the driving control signals and the power signal that are applied from the circuit substrate 300. An output terminal of the second driving chip package 500 is electrically connected to a gate line among the gate lines of the display panel 200.

In addition, the display apparatus 100 may further include an additional circuit substrate (not shown) electrically connected to the second driving chip packages 500.

Figure 2:
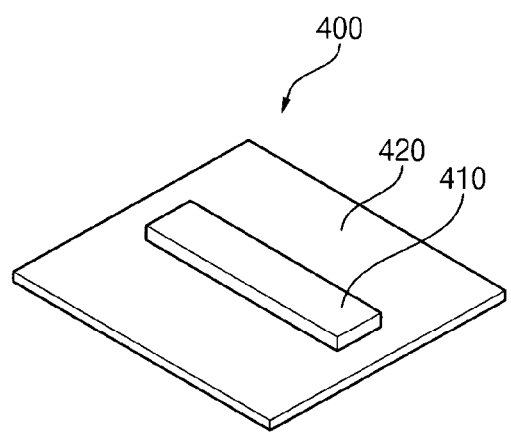
FIG. 2 is a perspective view illustrating an exemplary first driving chip package of FIG. 1.
Figure 3:
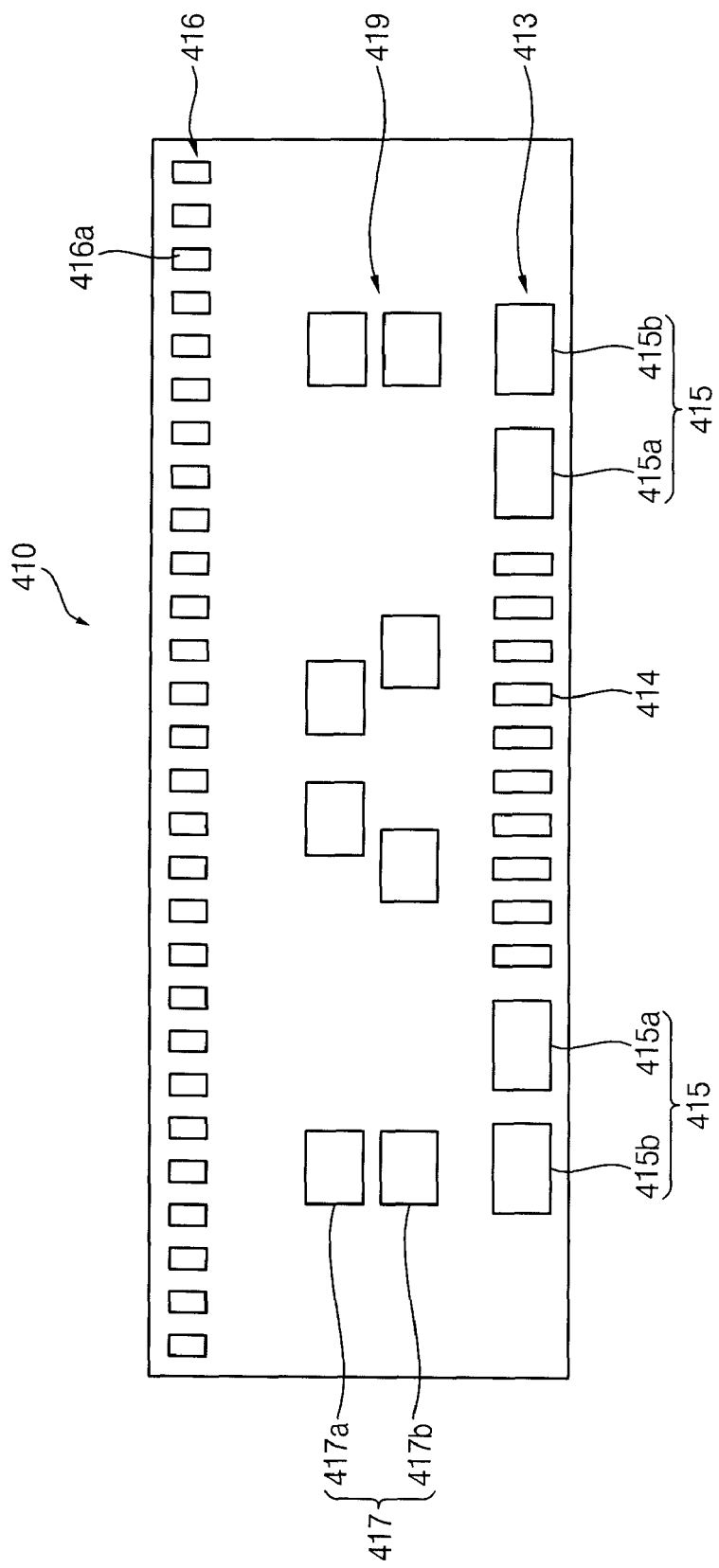
FIG. 3 is a plan view illustrating an exemplary terminal surface of the exemplary driving chip of FIG. 2.
Figure 4:
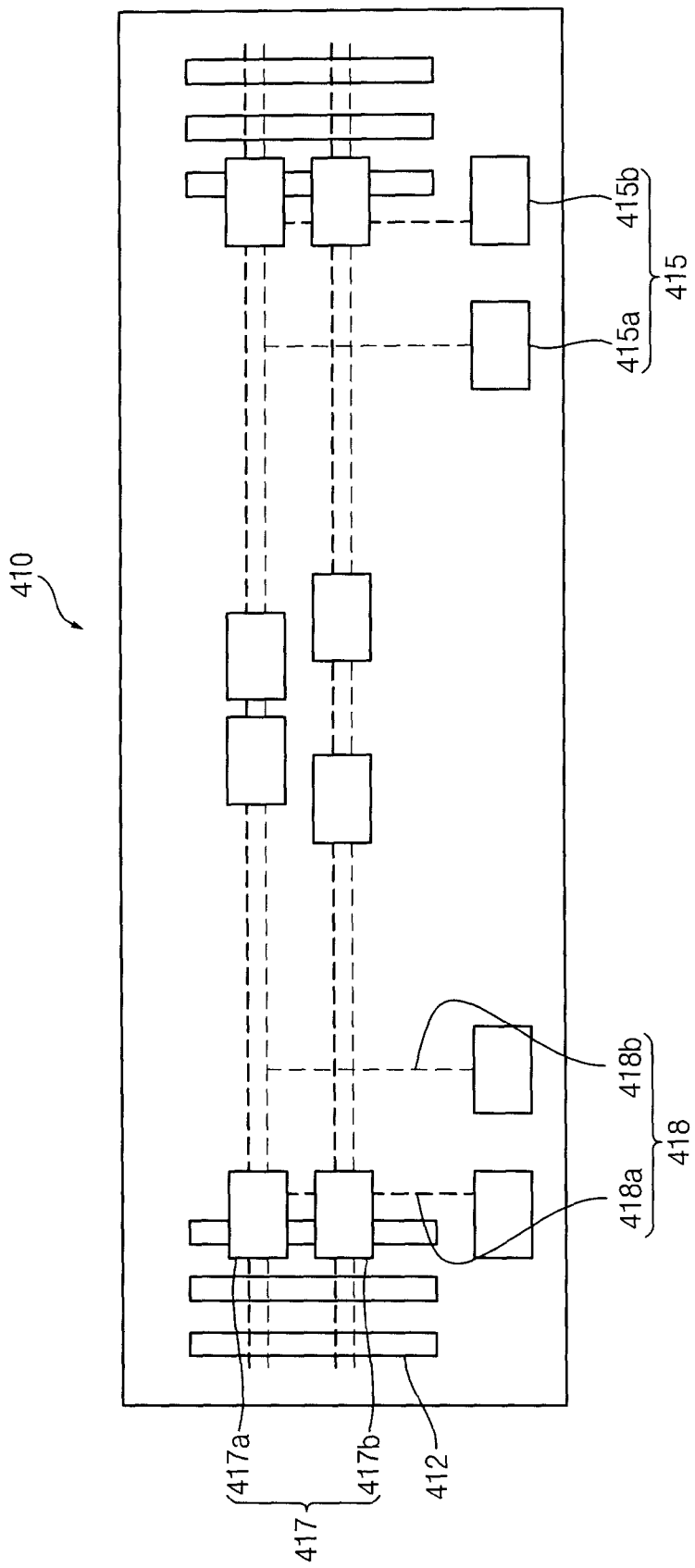
FIG. 4 is a block diagram schematically illustrating the inside of the exemplary driving chip of FIG. 2.
Figure 5:
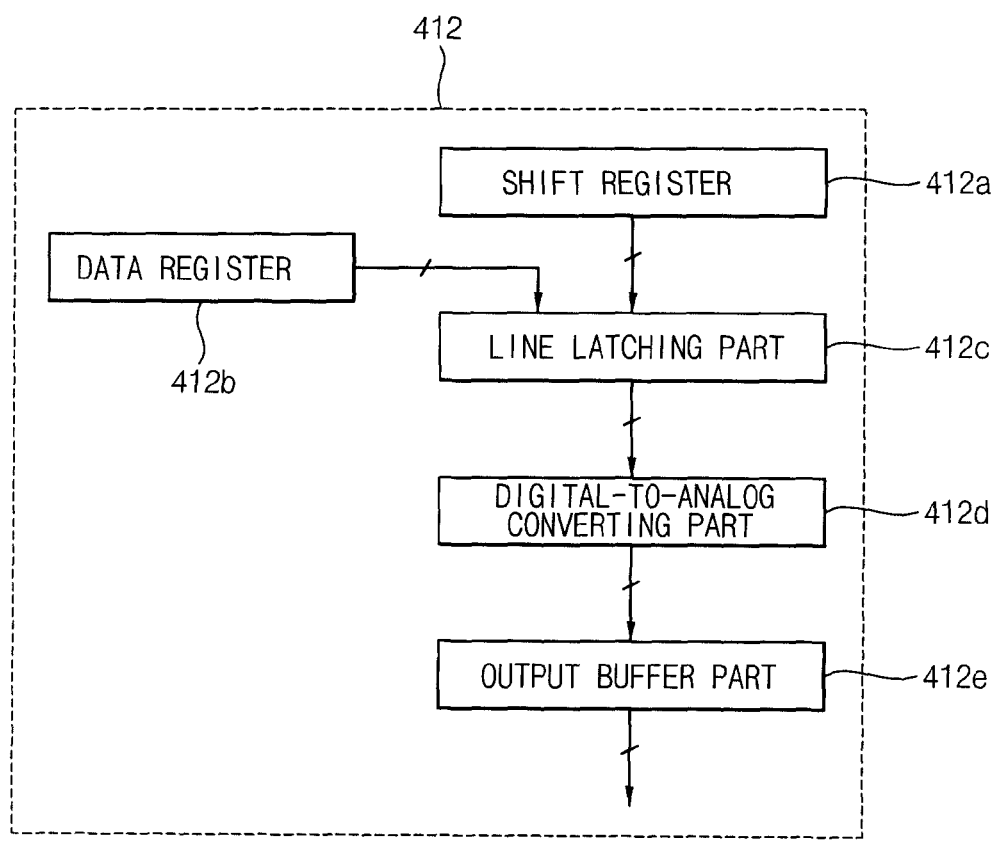
FIG. 5 is a block diagram schematically illustrating the inside of an exemplary circuit cell of FIG. 4.

FIG. 2 is a perspective view illustrating an exemplary first driving chip package 400 of FIG. 1. FIG. 3 is a plan view illustrating an exemplary terminal surface of the exemplary driving chip 410 of FIG. 2. FIG. 4 is a block diagram schematically illustrating the inside of the exemplary driving chip 410 of FIG. 2. FIG. 5 is a block diagram schematically illustrating the inside of an exemplary circuit cell of FIG. 4.

Referring to FIGS. 2 to 5, the first driving chip package 400 includes a driving chip 410 and a line substrate 420.

The driving chip 410 includes an input part 413, a plurality of unit cells 412, an output part 416 and an auxiliary input terminal 417. The input part 413 may also be termed a main input part.

The plurality of circuit cells 412 is formed on the inside of the driving chip 410, as shown in FIG. 4. The circuit cells 412 generate a plurality of data signals for driving the display panel 200 in response to the driving control signals and the power signal that are applied from the circuit substrate 300 through the input part 413, and outputs the data signals to the output part 416. For example, the circuit cells 412 may include the number of output terminals 416a of the output part 416.

As shown in FIG. 5, each of the circuit cells 412 may include a shift register 412a, a data register 412b, a line latching part 412c, a digital-to-analog converter ("DAC") 412d and an output buffer part 412e.

The shift register 412a generates a sequential latch pulse to provide the line latching part 412c with the sequential latch pulse. That is, the shift register 412a shifts the latch pulse in response to a horizontal start signal STH that is inputted from a timing control part of the circuit substrate 300, and provides the line latching part 412c with the shifted latch pulse.

The data register 412b receives a digital data signal DATA', that includes red, green and blue color data signals R', G', B' of a digital type from the circuit substrate 300, and provides the line latching part 412c with the digital data signal DATA'.

The line latching part 412c latches the digital data signal DATA' by a line unit, and outputs the data signal DATA' to the DAC 412d in response to a load signal TP.

The DAC 412d converts the digital data signal DATA' provided from the line latching part 412c into a data signal of an analog type, that is, a data voltage based on a gradation voltage, and outputs the data voltage to the output buffer part 412e.

The output buffer part 412e adjusts the data signal of an analog type to approach a reference level, and outputs the adjusted data signal to the display panel 200, such as to the data lines of the display panel 200.

A level shifter, an amplifier, etc. may be configured in the DAC 412d and the output buffer part 412e. The level shifter and the amplifier may receive a power signal from the circuit substrate 300.

With reference again to FIGS. 3 and 4, the input part 413 is formed at a first end portion of the driving chip 410 along a length direction of the driving chip 410. The input part 413, or main input part 413, may include a plurality of input terminals 414 receiving the driving control signals from the circuit substrate 300, which may be termed main input terminals, and at least one power input terminal 415 receiving the power signal from the circuit substrate 300. The at least one power input terminal 415 may also be termed a main power input terminal.

The at least one power input terminal 415 may include at least one first power terminal 415a receiving a first power signal and at least one second power terminal 415b receiving a second power signal that is different from the first power signal. For example, the first power signal may be about 15 V, and the second power signal may substantially be a ground voltage (i.e., 0 V).

The first and second power terminals 415a and 415b may be formed at two end portions of the signal input terminals 414, respectively. That is, a first power input terminal 415 may be provided adjacent a first end portion of the row of signal input terminals 414, and a second power input terminal 415 may be provided adjacent a second end portion of the row of signal input terminals 414, such that first and second power terminals 415a, 415b may be provided adjacent the first end portion of the row of signal input terminals 414, and first and second power terminals 415a, 415b may be provided adjacent the second end portion of the row of signal input terminals 414.

The output part 416 includes a plurality of output terminals 416a formed at a second end portion facing the first end portion of the driving chip 410 along a length direction of the driving chip 410. The output terminals 416a are electrically connected to the circuit cells 412, respectively. The data signals generated from the circuit cells 412 may be outputted to the exterior though the output terminals 416a.

The auxiliary input part 419 is spaced apart from the circuit cells 412 by a first distance that is shorter than a second distance between the input part 413 and the auxiliary input part 419. The auxiliary input part 419 receives the power signal that is applied to the input part 413 to apply the power signal to the circuit cells 412. For example, the auxiliary input part 419 may include at least one auxiliary power input terminal 417 formed between the input part 413 and the output part 416 of the driving chip 410. In an exemplary embodiment, the auxiliary input part 419 is provided between the power input terminals 415 and the output part 416, although there may be more auxiliary power input terminals 417 than power input terminals 415.

The at least one auxiliary power input terminal 417 receives the power signal that is substantially equal to the power signal applied to the at least one power input terminal 415. For example, the at least one auxiliary power input terminal 417 may include at least one first auxiliary terminal 417a receiving a first power signal, and at least one second auxiliary terminal 417b receiving a second power signal. The first power signal is substantially equal to a power signal that is applied to the first power terminal 415a. The second power signal is substantially equal to a power signal that is applied to the second power terminal 415b.

The first and second auxiliary terminals 417a and 417b may be formed along a length direction of the driving chip 410, respectively. That is, all of the first auxiliary terminals 417a may be arranged along a length direction of the driving chip 410, and all of the second auxiliary terminals 417b may be arranged along a length direction of the driving chip 410. In the illustrated exemplary embodiment, four first auxiliary terminals 417a and four second auxiliary terminals 417b are shown, however alternative exemplary embodiments may employ alternative numbers of first and second auxiliary terminals 417a, 471b.

As shown in FIG. 4, a power line 418 is formed on the inside of the driving chip 410, which electrically connects to the circuit cells 412 and to the at least one power input terminal 415 and at least one auxiliary power input terminal 417. For example, the power line 418 may be electrically connected to the level shifter, the amplifier, etc., respectively, that are configured on the inside of the circuit cells 412. That is, the power line 418 is extended from the at least one power input terminal 415, and at least two of the power lines 418 are connected to the circuit cells 412 in parallel with each other.

The power line 418 may include a first power line 418a electrically connected to the first power terminal 415a and a second power line 418b electrically connected to the second power terminal 415b. The first and second power lines 418a, 418b may extend from each of the first and second power terminals 415a, 415b, respectively.

The first power signal that is applied to the first power terminal 415a is applied to the circuit cells 412 through the first power line 418a, and the second power signal that is applied to the second power terminal 415b is applied to the circuit cells 412 through the second power line 418b. The first auxiliary terminal 417a is electrically connected to the first power line 418a, and the second auxiliary terminal 417b is electrically connected to the second power line 418b. The auxiliary input terminals 417 arranged between signal input terminals 414 and the output terminals 416a may be electrically connected to the power lines 418 that extend in a length direction of the driving chip 410.

The signal input terminals 414, the at least one power input terminal 415, the output terminals 416a and the at least one auxiliary power input terminal 417 may be formed in a bump shape.

Figure 6:
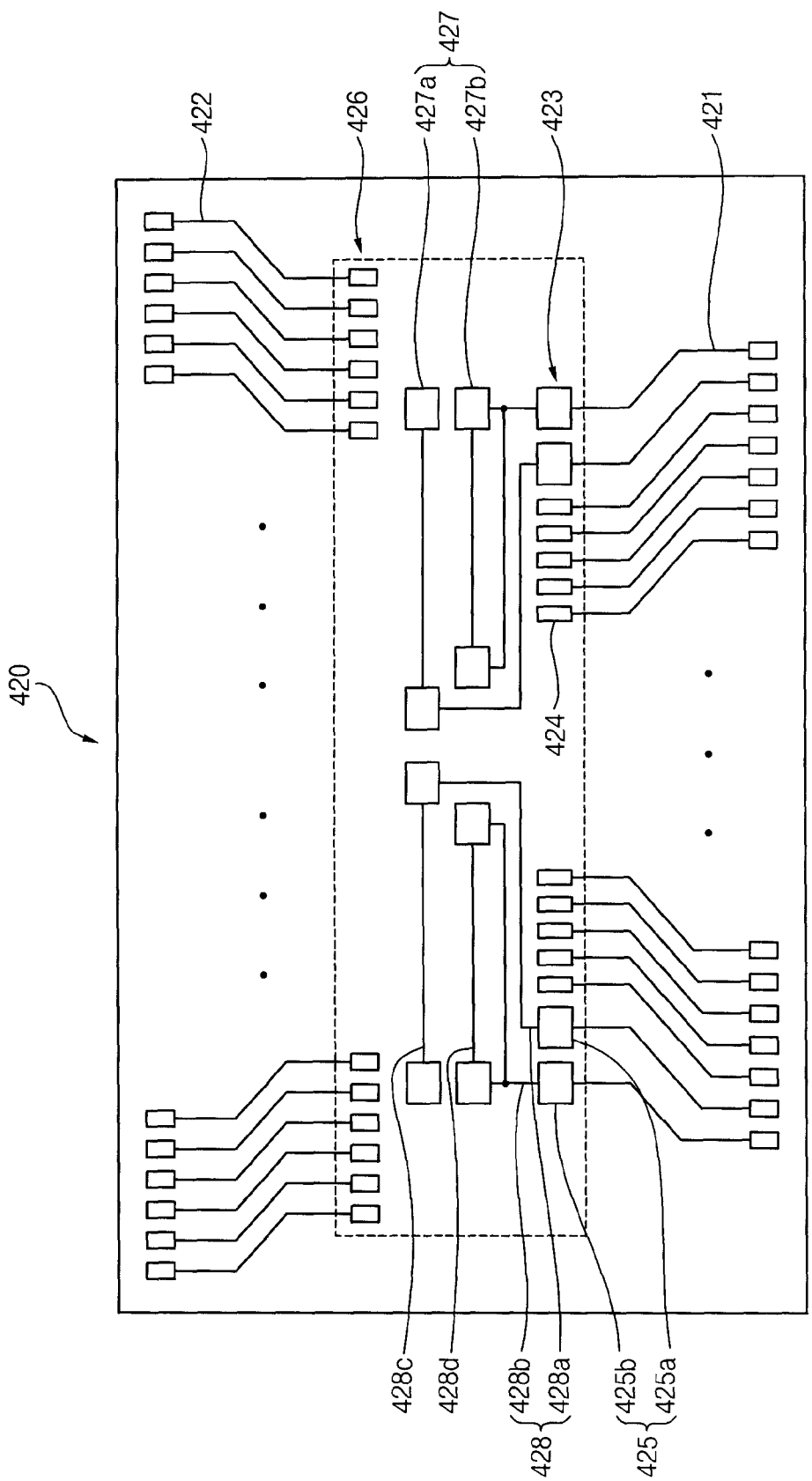
FIG. 6 is a plan view illustrating the exemplary line substrate of FIG. 2.

FIG. 6 is a plan view illustrating the exemplary line substrate 420 of FIG. 2.

Referring to FIGS. 3, 4 and 6, the line substrate 420 is coupled to the driving chip 410. For example, the driving chip 410 may be coupled to the line substrate 420 in a position that corresponds to an area indicated by the dotted line of the line substrate 420, as shown in FIG. 6. For example, the line substrate 420 may be coupled to the driving chip 410 through an anisotropic conductive film ("ACF"). Thus, a plurality of terminals of the driving chip 410 is electrically connected to a plurality of pads of the line substrate 420, respectively. The line substrate 420 may include a flexible film having a copper line formed thereon.

The line substrate 420 includes a plurality of input pads 423, a plurality of output pads 426 and at least one auxiliary power input pad 427 that are electrically connected to terminals of the driving chip 410.

The input pads 423 include a plurality of signal input pads 424 electrically connected to the signal input terminals 414 of the driving chip 410, and at least one power input pad 425 respectively electrically connected to the at least one power input terminal 415.

Each of the at least one power input pad 425 may include a first power pad 425a electrically connected to a respective first power terminal 415a, and a second power pad 425b electrically connected to a respective second power terminal 415b.

The output pads 426 are respectively electrically connected to the output terminals 416a of the driving chip 410.

The at least one auxiliary power input pad 427 is formed between the input pads 423 and the output pads 426 to be respectively electrically connected to the at least one auxiliary power input terminal 417. Each of the at least one auxiliary power input pad 427 may include a first auxiliary pad 427a electrically connected to a respective first auxiliary terminal 417a, and a second auxiliary pad 427b electrically connected to a respective second auxiliary terminal 417b. A plurality of first and second auxiliary pads 427a and 427b may be formed in correspondence with the first and second auxiliary terminals 417a and 417b, respectively.

The line substrate 420 may further include an auxiliary power line 428 for electrically connecting the at least one power input terminal 415 of the driving chip 410 to the at least one auxiliary power input terminal 417. The auxiliary power line 428 may electrically connect the at least one power input pad 425 to the at least one auxiliary power input pad 427. The auxiliary power line 428 may include copper having low resistivity.

The auxiliary power line 428 electrically connects to the power input pad 425 and to the auxiliary power input pad 427. For example, the auxiliary power line 428 may include a first auxiliary line 428a electrically connecting the first power input pad 425a to one of the first auxiliary pads 427a, and a second auxiliary line 428b electrically connecting the second power input pad 425b to one of the second auxiliary pads 427b.

The first and second auxiliary pads 427a and 427b may be disposed to be electrically isolated from the first and second auxiliary lines 428a and 428b, respectively.

The auxiliary power line 428 may include a plurality of sub-auxiliary lines 428c and 428d electrically connecting the auxiliary power input pads 427 adjacent to each other. For example, the auxiliary power line 428 may include first sub-auxiliary lines 428c electrically connecting the first auxiliary pads 427a to each other and second sub-auxiliary lines 428d electrically connecting the second auxiliary pads 427b to each other.

Each of the driving control signals and the power signal that are applied from the circuit substrate 300 is transferred to the signal input pads 424 and the power input pad 425, respectively, through first lead lines 421 formed on the line substrate 420.

The power signal transferred to the power input pad 425 is applied to the circuit cells 412 of the driving chip 410 through the power line 418 formed on the inside of the driving chip 410. Moreover, the power signal transferred to the power input pad 425 is applied to the auxiliary power input pad 427 through the auxiliary power line 428 formed on the line substrate 420, and is applied to the circuit cells 412 through the power line 418 electrically connected to the auxiliary power input pad 427 via the auxiliary power input terminal 417.

For example, the first power signal that is transferred to the first power pad 425a may be applied to the first power terminal 415a of the driving chip 410, and then applied to the circuit cells 412 through the first power line 418a. Simultaneously, the first power signal is transferred to one of the first auxiliary pads 427a through the first auxiliary line 428a and one of the first sub-auxiliary lines 428c from the first power terminal 415a, and then is applied to the circuit cells 412 through the first power line 418a via the first auxiliary terminal 417a electrically connected to the first auxiliary pad 427a. Moreover, the second power signal that is transferred to the second power pad 425b is applied to the second power terminal 415b of the driving chip 410, and then is applied to the circuit cells 412 through the second power line 418b. Simultaneously, the second power signal is transferred to one of the second auxiliary pads 427b through the second auxiliary line 428b and one of the second sub-auxiliary lines 428d from the second power terminal 415b, and then is applied to the circuit cells 412 through the second power line 418b via the second auxiliary terminal 417b electrically connected to the second auxiliary pad 427b.

Accordingly, the at least one auxiliary power input terminal 417 is formed between the at least one power input terminal 415 and the output terminals 426a of the driving chip 410, and the auxiliary power line 428 electrically connecting the at least one power input terminal 415 to the at least one auxiliary power input terminal 417, which includes a low resistance material such as copper, etc., is formed on the line substrate 420, so that variation of power transferred to each circuit cell 412 due to a line resistance may be more decreased than when only the power line 418 is formed in the driving chip 410.

When the auxiliary power line 428 is not formed on the line substrate 420, a variation between a first line resistance and a second line resistance may be about 10Ω. Here, the first line resistance is defined between the at least one power input terminal 415 and the circuit cells 412 that are closely spaced to the at least one power input terminal 415, and the second line resistance is defined between the at least one power input terminal 415 and the circuit cells 412 that are spaced far from the at least one power input terminal 415. For example, when the power line 418 is formed on the inside of the driving chip 410, a line resistance between the at least one power input terminal 415 and the circuit cell 412 that is far from the at least one power input terminal 415 may be about 10Ω. However, when the auxiliary power line 428 is formed in the line substrate 420, a line resistance between the at least one power input terminal 415 and the circuit cell 412 that is far from the at least one power input terminal 415 may be about 3Ω. On the other hand, when the auxiliary power line 428 is formed on the line substrate 420, a variation between a first line resistance and a second line resistance may be about 3Ω so that the variation of the line resistance between the circuit cells 412 may be greatly decreased. Therefore, the line resistance variation between the at least one power input terminal 415 and the circuit cells 412 is decreased, so that an output variation generated between output signals of the driving chip 410 may be decreased.

The data signal generated in the circuit cells 412 of the driving chip 410 is transferred to the display panel 200 though the output terminals 416a, the output pads 426 and the second lead lines 422 formed in the line substrate 420.

In this exemplary embodiment, the driving chip 410 is coupled to the line substrate 420. Alternatively, the auxiliary power line 428 may be formed on the display panel 200 of a chip-on-glass ("COG") structure, in which the driving chip 410 is directly mounted on the display panel 200, and thus an effect substantially the same as that of the present exemplary embodiment may be achieved.

According to the driving chip, the driving chip package having the driving chip, and the display apparatus having the driving chip, an auxiliary power input terminal is formed between input terminals and output terminals of a driving chip, and an auxiliary power line electrically connecting a power input terminal to the auxiliary power input terminal is formed on a line substrate coupled to the driving chip. Therefore, line resistance variation between circuit cells of the driving chip and the power input terminal may be decreased, so that driving chip defects may be prevented.

Although exemplary embodiments of the present invention have been described, it is understood that the present invention should not be limited to these exemplary embodiments but various changes and modifications can be made by one of ordinary skill in the art within the spirit and scope of the present invention as hereinafter claimed.

What is claimed is:

1. A driving chip comprising:
a main input part including a plurality of main input terminals which receive an external signal;
a plurality of circuit cells which generate a driving signal in response to a signal applied from the main input part; and
an auxiliary input part spaced apart from the circuit cells by a first distance that is shorter than a second distance between the main input part and the auxiliary input part, the auxiliary input part receiving the external signal and applying the external signal to the circuit cells,
wherein the main input part comprises at least one main power input terminal which receives a power signal, and the auxiliary input part comprises at least two auxiliary power input terminals which internally receive the power signal that is applied to each of the at least one main power input terminal.

2. The driving chip of claim 1, further comprising:
an output part formed in correspondence with the circuit cells, the output part including a plurality of output terminals outputting the driving signal that is generated by the circuit cells to the exterior.

3. The driving chip of claim 2, wherein the main input part is formed along a length direction of a first end portion of the driving chip, the output part is formed along a length direction of a second end portion of the driving chip, and the auxiliary input part is formed between the main input part and the output part.

4. The driving chip of claim 2, wherein the at least one main power input terminal, the output terminals and the at least two auxiliary power input terminals have a terminal shape, respectively.

5. The driving chip of claim 1, further comprising:
a power line electrically connecting the circuit cells to the at least one main power input terminal, and electrically connecting the circuit cells to the auxiliary input terminal.

6. The driving chip of claim 5, wherein the power line is electrically connected to an amplifier and a level shifter that are formed in the circuit cells.

7. A driving chip package comprising:
a driving chip including:
a main input part including a plurality of main input terminals which receive an external signal,
a plurality of circuit cells which generate a driving signal in response to a signal applied from the main input part, and
an auxiliary input part spaced apart from the circuit cells by a first distance that is shorter than a second distance between the main input part and the auxiliary input part, the auxiliary input part receiving the external signal and applying the external signal to the circuit cells; and
a line substrate including an auxiliary power line coupled to the driving chip, the auxiliary power line electrically connecting a portion of the main input part to the auxiliary input part,
wherein the main input part comprises at least one main power input terminal which receives a power signal, and
the auxiliary input part comprises at least two auxiliary power input terminals which internally receive the power signal that is applied to each of the at least one main power input terminal.

8. The driving chip package of claim 7, wherein the line substrate comprises:
a main power input pad electrically connected to the at least one main power input terminal; and
an auxiliary power input pad electrically connected to the at least two auxiliary power input terminals,
wherein the auxiliary power line electrically connects the main power input pad to the auxiliary power input pad.

9. The driving chip package of claim 8, wherein the driving chip further comprises:
an output part formed in correspondence with the circuit cells, respectively, the output part including a plurality of output terminals which output the driving signal generated by the circuit cells to the exterior.

10. The driving chip package of claim 9, wherein the main input part is formed along a length direction of a first end portion of the driving chip, the output part is formed along a length direction of a second end portion of the driving chip, and the auxiliary input part is formed between the main input part and the output part.

11. The driving chip package of claim 9, wherein the at least one main power input terminal, the output terminals and the at least two auxiliary power input terminals have a terminal shape, respectively.

12. The driving chip package of claim 8, wherein the driving chip further comprises a main power line which electrically connects the circuit cells to the at least one main power input terminal and electrically connects the circuit cells to the auxiliary input terminal.

13. The driving chip package of claim 12, wherein the main power line is electrically connected to an amplifier formed in the circuit cells and a level shifter formed in the circuit cells.

14. The driving chip package of claim 8, wherein the at least two auxiliary power input terminals are formed along a length direction of the driving chip, and
the auxiliary power input pads are formed in correspondence with the at least one auxiliary power input terminal.

15. The driving chip package of claim 14, wherein the auxiliary power line further comprises a sub-auxiliary line electrically connecting the auxiliary power input pads adjacent to each other.

16. A display apparatus comprising:
a display panel which displays an image;
a circuit substrate which outputs a plurality of driving control signals which drive the display panel and a power signal; and
a driving chip package which electrically connects the display panel to the circuit substrate, wherein the driving chip package comprises:
a driving chip including:
a main input part including a plurality of main power input terminals which receive a power signal,
a plurality of circuit cells which generate a driving signal in response to a signal applied from the main input part, and
an auxiliary input part spaced apart from the circuit cells by a first distance that is shorter than a second distance between the main input part and the auxiliary input part, the auxiliary input part receiving the power signal applied to the main power input terminals and applying the power signal to the circuit cells, and the auxiliary input part including at least two auxiliary power input terminals; and a line substrate including an auxiliary power line coupled to the driving chip, the auxiliary power line electrically connected to a portion of the main input part and the auxiliary input part, wherein the line substrate comprises:

a main power input pad electrically connected to the main power input terminals; and at least two auxiliary power input pads electrically connected to each of the at least two auxiliary power input terminals.

17. The display apparatus of claim 16, wherein the driving chip further comprises a main power line which electrically connects the circuit cells to the main power input terminals and electrically connects the circuit cells to the at least two auxiliary power input terminals.

18. A method of reducing line resistance variation between circuit cells of a driving chip, the method comprising:

arranging at least two auxiliary power input terminals between a main power input terminal and an output part of the driving chip, the auxiliary power input terminal providing a signal to the circuit cells via a main power line;

arranging a main power input pad and at least two auxiliary power input pads on a line substrate;

electrically connecting the main power input pad and the at least two auxiliary power input pads with an auxiliary power line formed on the line substrate; and disposing the driving chip on the line substrate to electrically connect the main power input terminal to the at least two auxiliary power input terminals via the auxiliary power line, wherein the auxiliary power input terminal is spaced apart from the circuit cells by a first distance that is shorter than a second distance between the main power input terminal and the auxiliary power input terminal.

* * * * *